(12) United States Patent
Liu et al.

(10) Patent No.: US 8,297,223 B2
(45) Date of Patent: Oct. 30, 2012

(54) METHOD AND APPARATUS FOR PARTICLE FILTRATION AND ENHANCING TOOL PERFORMANCE IN FILM DEPOSITION

(75) Inventors: Benjamin Liu, North Oaks, MN (US); Yamin Ma, Roseville, MN (US); Thuc Dinh, Savage, MN (US)

(73) Assignee: MSP Corporation, Shoreview, MN (US)

( * ) Notice: Subject to any disclaimer, the term of this patent is extended or adjusted under 35 U.S.C. 154(b) by 1009 days.

(21) Appl. No.: 12/235,114

(22) Filed: Sep. 22, 2008

(65) Prior Publication Data

US 2009/0084315 A1 Apr. 2, 2009

Related U.S. Application Data

(60) Provisional application No. 60/997,197, filed on Oct. 2, 2007, provisional application No. 60/999,280, filed on Oct. 17, 2007.

(51) Int. Cl.
*C23C 16/448* (2006.01)
*C23F 1/00* (2006.01)
*C23C 16/06* (2006.01)
*C23C 16/22* (2006.01)

(52) U.S. Cl. ............. 118/723 VE; 118/726; 156/345.33

(58) Field of Classification Search ............ 118/723 VE, 118/726; 156/345.33
See application file for complete search history.

(56) References Cited

U.S. PATENT DOCUMENTS

| | | | | |
|---|---|---|---|---|
| 4,328,763 A * | 5/1982 | Sommerkamp et al. | ...... | 118/727 |
| 4,661,132 A * | 4/1987 | Thornton et al. | ............... | 55/486 |
| 5,078,976 A * | 1/1992 | Shibauchi et al. | ............ | 422/298 |
| 5,123,375 A * | 6/1992 | Hansen | ......................... | 118/715 |
| 5,162,287 A * | 11/1992 | Yoshimoto et al. | ............ | 502/439 |
| 5,215,253 A * | 6/1993 | Saidman et al. | ................. | 239/61 |
| 5,362,328 A * | 11/1994 | Gardiner et al. | ............... | 118/726 |
| 5,520,858 A * | 5/1996 | Yamaguchi et al. | ........... | 261/130 |
| 5,536,323 A * | 7/1996 | Kirlin et al. | ..................... | 118/726 |
| 5,537,508 A * | 7/1996 | Ebbing et al. | .................. | 392/402 |
| 5,681,613 A * | 10/1997 | Hansen | ....................... | 427/248.1 |
| 5,863,311 A * | 1/1999 | Nagai et al. | ...................... | 55/483 |
| 5,981,295 A * | 11/1999 | Schmitt | .......................... | 436/180 |
| 6,098,964 A * | 8/2000 | Schmitt | ............................ | 261/75 |
| 6,099,653 A * | 8/2000 | Bhandari et al. | ............... | 118/726 |
| 6,113,699 A * | 9/2000 | Hansen | .......................... | 118/715 |
| 6,210,485 B1 * | 4/2001 | Zhao et al. | ...................... | 118/724 |
| 6,296,711 B1 * | 10/2001 | Loan et al. | ...................... | 118/726 |
| 6,409,839 B1 | 6/2002 | Sun et al. | ........................ | 118/726 |
| 6,635,114 B2 * | 10/2003 | Zhao et al. | ...................... | 118/715 |
| 6,699,524 B2 * | 3/2004 | Kesala | ......................... | 427/248.1 |
| 6,835,221 B2 * | 12/2004 | Rikyuu et al. | .................... | 55/315 |
| 6,874,770 B2 * | 4/2005 | Torkaman | ....................... | 261/130 |

(Continued)

FOREIGN PATENT DOCUMENTS

JP 2000150497 A * 5/2000

(Continued)

*Primary Examiner* — Rudy Zervigon
(74) *Attorney, Agent, or Firm* — Westman, Champlin & Kelly, P.A.

(57) ABSTRACT

This disclosure pertains to a method and apparatus to permit changing a filter on the input line to a vacuum deposition chamber without breaking or reducing the vacuum for the deposition chamber and other components in the deposition system. Isolation valves are provided at the inlet and outlet of the filter so the filter can be isolated from the source of vacuum and the deposition chamber for removal and replacement of the filter.

4 Claims, 4 Drawing Sheets

U.S. PATENT DOCUMENTS

| | | | |
|---|---|---|---|
| 6,890,616 B2 * | 5/2005 | Suwabe et al. | 428/117 |
| 6,906,296 B2 * | 6/2005 | Centanni et al. | 219/628 |
| 6,915,592 B2 * | 7/2005 | Guenther | 34/582 |
| 7,141,095 B2 * | 11/2006 | Aitchison et al. | 95/273 |
| 7,294,208 B2 * | 11/2007 | Guenther | 118/715 |
| 7,618,027 B2 * | 11/2009 | Spiegelman | 261/130 |
| 7,666,260 B2 * | 2/2010 | Iizuka | 118/726 |
| 7,862,646 B2 * | 1/2011 | Carruthers et al. | 95/131 |
| 7,883,745 B2 * | 2/2011 | Marsh et al. | 427/248.1 |
| 2002/0134307 A1 * | 9/2002 | Choi | 118/715 |
| 2003/0033978 A1 * | 2/2003 | Zhao et al. | 118/715 |
| 2004/0025370 A1 * | 2/2004 | Guenther | 34/576 |
| 2004/0086642 A1 * | 5/2004 | Kesala | 427/248.1 |
| 2004/0163590 A1 * | 8/2004 | Tran et al. | 118/715 |
| 2005/0147749 A1 * | 7/2005 | Liu et al. | 427/248.1 |
| 2005/0257735 A1 * | 11/2005 | Guenther | 117/89 |
| 2006/0219168 A1 * | 10/2006 | Brcka | 118/715 |
| 2007/0089674 A1 * | 4/2007 | Aitchison et al. | 118/715 |
| 2007/0108641 A1 * | 5/2007 | Okabe et al. | 261/118 |
| 2007/0117383 A1 * | 5/2007 | Aitchison et al. | 438/680 |
| 2007/0120275 A1 * | 5/2007 | Liu | 261/100 |
| 2007/0266944 A1 * | 11/2007 | Iizuka et al. | 118/722 |
| 2008/0302246 A1 * | 12/2008 | Carruthers et al. | 96/154 |
| 2009/0084315 A1 * | 4/2009 | Liu et al. | 118/715 |
| 2009/0293807 A1 * | 12/2009 | Liu et al. | 118/667 |
| 2010/0308481 A1 * | 12/2010 | Oglesby et al. | 261/131 |

FOREIGN PATENT DOCUMENTS

JP 2005000767 A * 1/2005

* cited by examiner

METHOD AND APPARATUS FOR PARTICLE FILTRATION AND ENHANCING TOOL PERFORMANCE IN FILM DEPOSITION

CROSS REFERENCE TO RELATED APPLICATIONS

This disclosure claims priority based on U.S. provisional Application Ser. No. 60/997,197, filed Oct. 2, 2007 and also claims priority based on U.S. provisional Application Ser. No. 60/999,280, filed Oct. 17, 2007, the disclosures of both applications Ser. No. 60/997,197 and 60/999,280 are incorporated by reference in their entireties.

BACKGROUND OF THE DISCLOSURE

The present disclosure relates to a method and apparatus to permit changing a filter on the input line to a vacuum deposition chamber without breaking or reducing the vacuum for the deposition chamber or for the rest of the deposition system.

In thin film deposition for semiconductor applications, it is often necessary to vaporize a precursor chemical in liquid or solid form to generate a vapor. Film deposition can then take place by a vapor phase process such as chemical vapor deposition (CVD), atomic layer deposition (ALD), and other known processes. A carrier gas is often introduced into the vaporization apparatus to form a gas/vapor mixture to meet specific processing requirements.

Vaporization of a liquid or solid precursor to form vapor is often accompanied by the formation of particles. These particles may range in size from a few nanometers (nm) in diameter to hundreds or thousands of nanometers. Particles carried by the gas/vapor mixture into the deposition chamber can deposit on the wafer surface causing harmful effects, including the loss of product yield. Product yield loss due to particulate contamination is a major cause of decreased product output in a semiconductor device fab. Left uncontrolled, particulate contamination can severely impact the productivity and profitability of the device fab.

One known method of reducing particulate contamination of wafers is to place a filter in the incoming process gas stream to remove particles and prevent them from being carried by the stream into the deposition chamber. Precursor vaporization systems such as those described in U.S. Pat. No. 6,409,839 includes a filter for particle removal, thus insuring that the output gas/vapor mixture will be substantially free of particulate contamination. Since hot vapor can condense in a cold filter, the filter must be heated. The vaporization apparatus described in U.S. Pat. No. 6,409,839 has a built-in filter that is heated to substantially the same temperature as the remaining parts of the system, thus minimizing potential vapor condensation on an unheated or insufficiently heated filter.

One consequence of using a filter in a film deposition apparatus, also referred to as a tool, is that the filter can get clogged during use due to particle accumulation in the filter. A clogged filter will cause an increase in filter pressure drop. A clogged filter can also cause particle shedding, resulting in particles collected on the filter being re-entrained by the gas/vapor flow, and resuspended in the mixture stream. These re-entrained and resuspended particles reappear as gas-borne particulate contaminant downstream of the filter and thus are carried by the mixture flow into the deposition chamber to contaminate the wafer placed therein. When this happens, the filter must be removed and replaced.

Replacing a filter in the vaporization apparatus or tool will require removing a clogged filter and replace it by a new one. In the case of the vaporization apparatus including a filter described in U.S. Pat. No. 6,409,839, the entire vaporizer or vaporization apparatus must be removed from the system. Removing a filter or a vaporizer from a film deposition tool, will require shutting down the tool resulting in the loss of productive use of the tool time for film deposition and device fabrication purposes. U.S. Pat. No. 6,409,839 does show vaporizer apparatus or mechanisms, and is incorporated by reference.

Shutting down a film deposition tool operating under vacuum generally requires breaking the system vacuum and returning the tool to atmospheric pressure in order for the filter to be removed and replaced. When a filter or a vaporizer is removed from a tool, normal ambient air in the cleanroom will enter into the deposition chamber causing various system components in fluid communication with the chamber to be exposed to contaminant gases brought in by ambient cleanroom air. Gaseous contaminants such as oxygen, water vapor, $CO_2$, $SO_2$, etc. that are present in small or trace amounts will thus enter the vacuum system causing the interior surfaces of the system to be coated with the molecules of the contaminant gas. Many of these contaminant gases are harmful to the semiconductor integrated circuit devices being fabricated and must be removed thoroughly before film deposition and device fabrication can resume. Contaminant molecules adhering to the interior surfaces of the vacuum system by physical adsorption or chemical absorption are difficult to remove. Their removal requires pumping down the system to a high vacuum for an extended period of time to permit the adsorbed contaminant gases to be desorbed or out gassed from the surfaces. The desorbing or out gassing process can take many hours to several days to complete. During this time, the deposition tool would sit idle and not used for production. The resulting loss of the productive use of the tool may be quite severe when many tools in a semiconductor device fab need to be shut-down for filter removal or maintenance.

SUMMARY OF THE DISCLOSURE

The present disclosure relates to a method and apparatus to significantly reduce the loss of productive vapor deposition tool use due to the need to remove and replace clogged filters One or more filters in the input process gas stream for a vapor deposition system is capable of being flow isolated from the rest of the system with valves so that a filter may be removed without breaking the vacuum of the deposition system.

In one embodiment, a pair of filters connected in parallel can each be separately isolated from the gas stream carrying conduits and the vacuum chamber with valves. A first filter thus can be connected to the input of the deposition system and a second filter isolated from the deposition system, so the first filter is operable to remove contaminates.

If the first filter clogs, it can be isolated from the other gas stream carrying conduits of the deposition system and replaced. The isolating valves for the second filter can be opened to connect the second filter into the gas stream carrying conduits of the deposition system. The deposition system or tool continues to operate using the second filter while the first filter is replaced.

The same approach can also be used to replace other system components that are in contact with the process gas stream and need to be removed for maintenance and service purposes. Using the component isolation features described in the present disclosure, the loss of productive tool time use can be significantly reduced.

DESCRIPTION OF THE EXEMPLARY EMBODIMENTS

Figure 1:
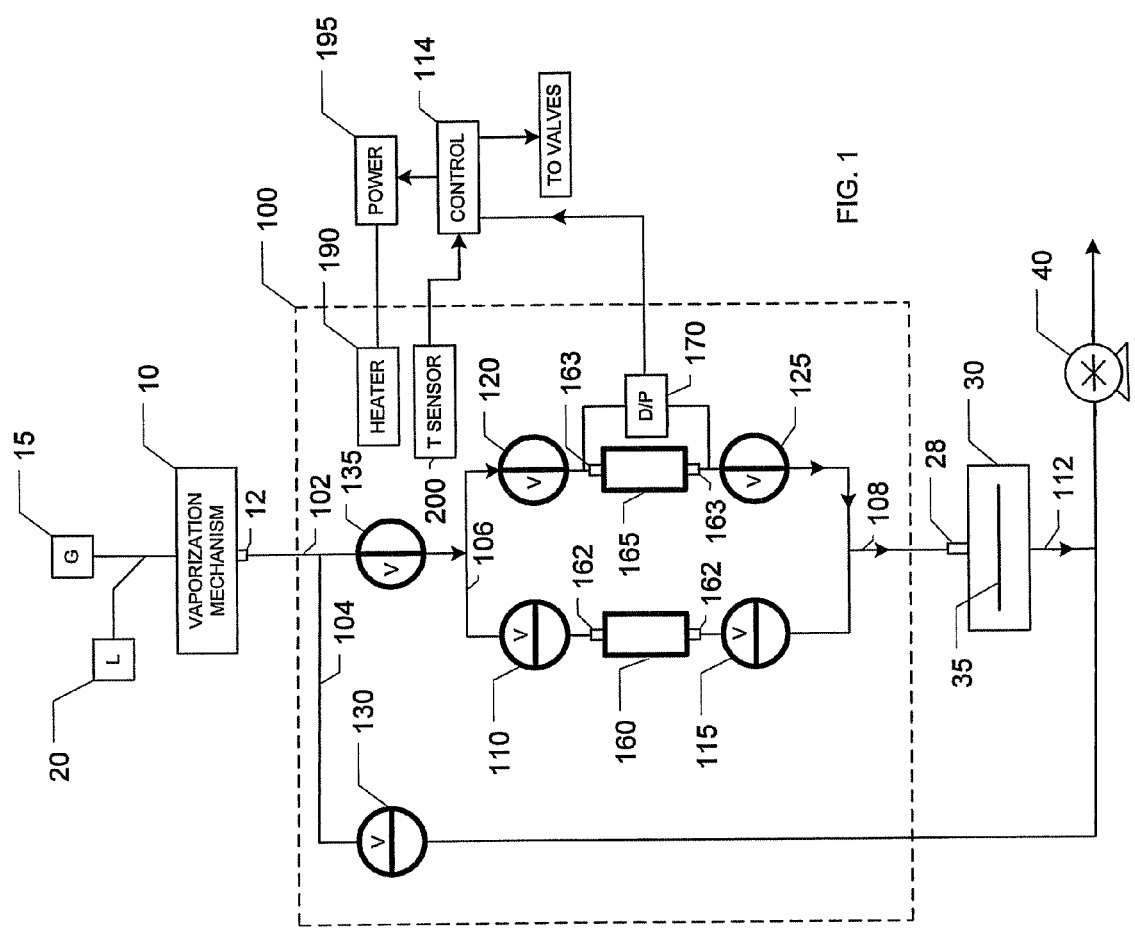
FIG. 1 is a schematic representation of a first form of the apparatus of the disclosure.

FIG. 1 shows a first embodiment of the present disclosure. A film deposition system or tool 8 includes a vaporizer 10, a vacuum deposition chamber 30 containing a wafer 35, as shown a semiconductor wafer, on which a film is to be deposited, and a vacuum pump 40 for creating a suitable vacuum in chamber 30 for thin film deposition on the wafer 35 by gas/vapor phase processes. The system input flow lines connected to the chamber 30 are also under vacuum during operation. Placed between vaporizer 10 and the deposition chamber 30 is a valve and filter apparatus shown generally at 100. For brevity, apparatus 100 is referred to as a VF apparatus or VFA for short. When used in the manner described below the VFA will allow a clogged filter to be removed without breaking the system vacuum. The film deposition tool can thus continue to operate without being shut down for filter maintenance or replacement.

The vaporizer 10 is connected to a source of gas 15, and a source of liquid 20. The gas and liquid from sources 15 and 20 flow into the vaporizer 10. The gas and the liquid are heated in the vaporizer to vaporize the liquid and form a gas/vapor mixture at the outlet 12. The liquid source 20 can also be internal to the vaporizer 10, in which case, the gas then bubbles through a heated liquid in the vaporizer to form a gas/vapor mixture. The vaporizing apparatus is then referred to as a bubbler, which is widely used for thin film deposition and semiconductor device fabrication. The terms vaporizer or vaporizing apparatus or mechanism includes various types of vaporizers, bubblers and mechanisms to create a gas/vapor mixture for a film deposition tool.

In a conventional film deposition tool not using the VFA 100, the gas/vapor mixture will enter the deposition chamber 30 through flow conduits connected from outlet 12 directly to chamber inlet 28. In some cases some intermediate switching valves may be used to facilitate the starting and stopping of the gas/vapor mixture flow. The gas/vapor mixture flow is introduced into the deposition chamber 30 through inlet 28 to cause a thin film to form on a wafer or substrate 35 mounted or contained in chamber 30.

In the present disclosure the VFA 100 is placed between the vaporizer outlet 12 and the deposition chamber inlet 28 and includes flow conduits to carry the gas/vapor mixture from outlet 12 to chamber inlet 28. A flow conduit 102 is connected to outlet 12, and connects to a valve 135. A bypass flow conduit 104 is connected to conduit 102 and a valve 130 is connected in conduit 104, which connects to a vacuum pump 40. The valves shown are on/off valves. They can be turned on or off manually or by remote control through valve actuators using compressed gas as an energy source. Other types of actuators also can be used for automatically operating the valves in response to control signals. In FIG. 1, valve 130 is in its shut-off position and valve 135 is in its open, or on position, to allow the gas/vapor mixture flow from the vaporizer to flow through to a branched conduit 106. The gas/vapor mixture then flows through conduit 106 to valve 120, which is open, through a first filter 165, and a valve 125, which is also open in a series flow connection. The gas/vapor mixture flow is carried by a conduit 108 and enters deposition chamber 30 through its inlet 28 for film deposition on one or more wafers 35 contained therein. An outlet conduit 112 is connected to vacuum pump 40 to provide vacuum to the vacuum chamber 30 and the rest of the system. In FIG. 1, one branch of conduit 106 is connected in series to a valve 110, a second filter 160 and a valve 115. Valve 115 connects to conduit 108. The series flow path of valve 120, second filter 160 and valve 115 is a path that is in parallel with valve 120, filter 165, and valve 125.

Valves 110 and 115 are both closed, i.e. in their shut-off position. Filter 160, which is placed between valves 110 and 115, is therefore isolated from the gas/vapor mixture flow and from the vacuum chamber 30. Valves 110 and 115 can be referred to as isolation valves for filter 160, since they can be turned off to keep the filter in flow isolation from the rest of the deposition tool. They can be opened to allow filter 160 to be placed in service for particle filtration of flow from the vaporizer 10 to the chamber 30 when needed.

Valves 120 and 125 are isolation valves for filter 165, since both can be closed to keep filter 165 in flow isolation from the rest of the deposition system. These valves 120 and 125 are initially open as shown in FIG. 1 when first filter 165 is used for particle filtration. When filter 165 becomes clogged, valves 120 and 125 can be closed to isolate filter 165. At the same time isolation valves 110 and 115 can be opened to allow filter 160 to be placed in service for particle filtration, thus allowing production to continue, while the clogged filter 165 is flow isolated, allowing it to be removed and/or replaced without breaking the vacuum in the deposition chamber or contaminating other flow conduits.

Each of the filters 165 and 160 have standard disconnectable connectors 163 and 162 at their inlet and outlet ends, respectively, to permit removal and replacement of the filters. A suitable connector 163 is in the flow conduit between the valve 120 and the inlet end of filter 165, and an outlet side connector 163 is between the outlet of the filter 165 and the valve 125. Connectors 162 are used between the valve 110 and the inlet end of filter 160 and between the outlet end of filter 160 and the valve 115. When the isolation valves are closed to prevent flow through the respective filter, the connectors can be disconnected and the filter removed and then the new or replacement filter can be slipped into place and connected using the connectors provided, without contaminating the conduits to which they are connected.

To prevent vapor condensation on valves, fittings, and filters in the VFA, all system components, flow conduits and parts in fluid communication with the gas/vapor mixture in the VFA must be kept at a suitably high temperature. When this temperature is higher than the ambient temperature surrounding the VFA, a heater 190 can be used to provide the heating energy input needed to keep the deposition system components at the desired temperature. The heating power for heater 190 comes from power source 195. The specific mechanism by which these components and parts are heated can be devised by those skilled in the art of heating system design for semiconductor applications and will not be further described here. The heater and the valves can be controlled with suitable manual or automatic controls 114. A temperature sensor 200 is used to determine the temperature of the VFA and provide a signal to the controls 114 to turn on the heater 190 if the temperature of the VFA is below a set limit, and to turn off the heater when the temperature is at a desired level. The temperature sensor can provide alarm signals for manual controls.

Valves 130 and 135 are shut off and flow diverting valves. When valve 135 is open the mixture flow can be directed to flow through one set of isolation valves and filter to deposition chamber 30 downstream. When valve 135 is closed and valve 130 is open, the gas/vapor mixture can be diverted away from the deposition chamber through flow conduit 104 for venting to the atmosphere by vacuum pump 40.

During system startup, all parts of the system need to be pumped down to a high vacuum for out gassing purposes. During this initial system pump down, all valves can be open, so that all system components can be out gassed at the same time by vacuum pump 40. Once the system is thoroughly pumped down, and begins to be used for film deposition, valves 130 and 135 can be opened and closed during each deposition cycle. Valves 110 and 115 can be closed to keep filter 160 in isolation, while valves 120 and 125 can be kept open to allow first filter 165 to be used for filtration.

When filter 165 becomes clogged due to use, it can be flow isolated by closing valves 120 and 125 as described earlier. Isolation valves 110 and 115 can immediately open by proper programming of controls 114 to allow production to continue using second filter 160. This cannot be accomplished in a conventional film deposition tool without the use of a VFA as described herein. With the isolation valves 120 and 125 closed, filter 165 can be removed and replaced by a new one.

Since a new filter 165 also needs to be pumped down and out gassed before it can be placed in service for production, this can be accomplished by pumping down the new filter 165 whenever there is some idle deposition tool time available. If desired, clogged filter 165 can be kept in isolation while filter 160 is used for production. When filter 160 becomes clogged, both sets of isolation valves can be closed allowing filters 160 and 165 both to be removed at the same time and replaced simultaneously. Filters 160 and 165 can then be pumped down together at the same time.

Valves 130 and 135 are not essential for the operation of the VFA. They are included to illustrate how a deposition chamber valve 135 and a diverter valve 130 can be included in the VFA to make a compact system that includes all the valves and filters needed to manage, control and filter the gas/vapor mixture flow from a vaporizer for use in a deposition chamber to enhance the reliability and productivity of the tool for thin film deposition and semiconductor device fabrication.

Figure 2:
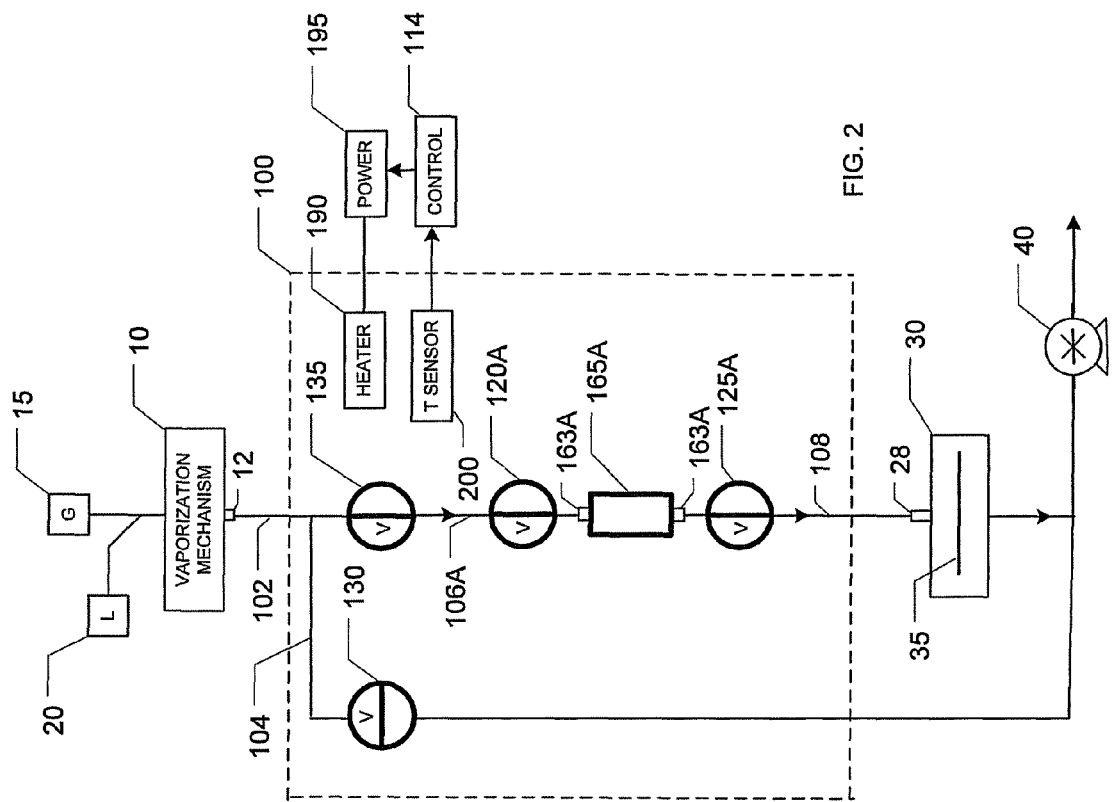
FIG. 2 is a schematic representation of a second form of the apparatus of the disclosure.

FIG. 2 shows a second embodiment of the present invention. It is simpler than the embodiment shown in FIG. 1. The numbers of like components described in FIG. 1 are the same in FIG. 2. In FIG. 2, there is only one single filter, 165A, and a single set of isolation valves. The branched flow conduit 106 is replaced with a flow conduit 106A from the valve 135 to the valve 120A, which connects to filter 165A and to valve 125A. The isolation valves 120A and 125A are used to isolate filter 165A when the filter gets clogged, allowing it to be removed and replaced by a new filter, using disconnectable connectors 163A at the inlet and outlet ends, without breaking the deposition system vacuum as explained earlier, by having the connectors 163A between the valve 120A and the inlet of the filter 165A and between the outlet of filter 165A and the valve 125A. Without a second filter and a second set of isolation valves (filter 160 and valves 110 and 115 in FIG. 1), the system in FIG. 2 will not permit production to continue while filter 165A is being removed and replaced. However, it will reduce the deposition tool shut down time, since the main system vacuum is not broken and the main vacuum deposition chamber 30 does not need to be pumped down during filter maintenance. Only the new filter needs to be pumped down and out gassed. The time to pump down a small filter and out gas the adsorbed contaminants is shorter than when the whole system needs to be pumped down in a conventional deposition tool. The system shown in FIG. 2 would also improve the productive use of deposition tool time, although not as much as one would achieve with the embodiment in FIG. 1.

A differential pressure sensor shown schematically at 170 (FIG. 1) may be used to determine when filter 165 is clogged. The sensor 170 will determine when the pressure drop exceeds a selective value and provide a signal to controls 114 for automatic valve operation or to activate a signal light or alarm when manual controls are used. Alternatively, switching flow from filter 165 to filter 160 can be based on time, i.e. the total time filter 165 is in active use for particle filtration; based on the number of wafers processed by the tool; or by the amount of liquid vaporized by vaporizer 10. This way filter 165 can be taken out of service by switching flow from filter 165 to filter 160 for preventive maintenance purposes, before filter 165 becomes fully clogged to cause actual damage to wafer 35 in chamber 30.

A sensor 170 also can be connected to the other filters such as 160 and 165A if desired. Other sensors to determine filter clogging can be used.

Figure 3:
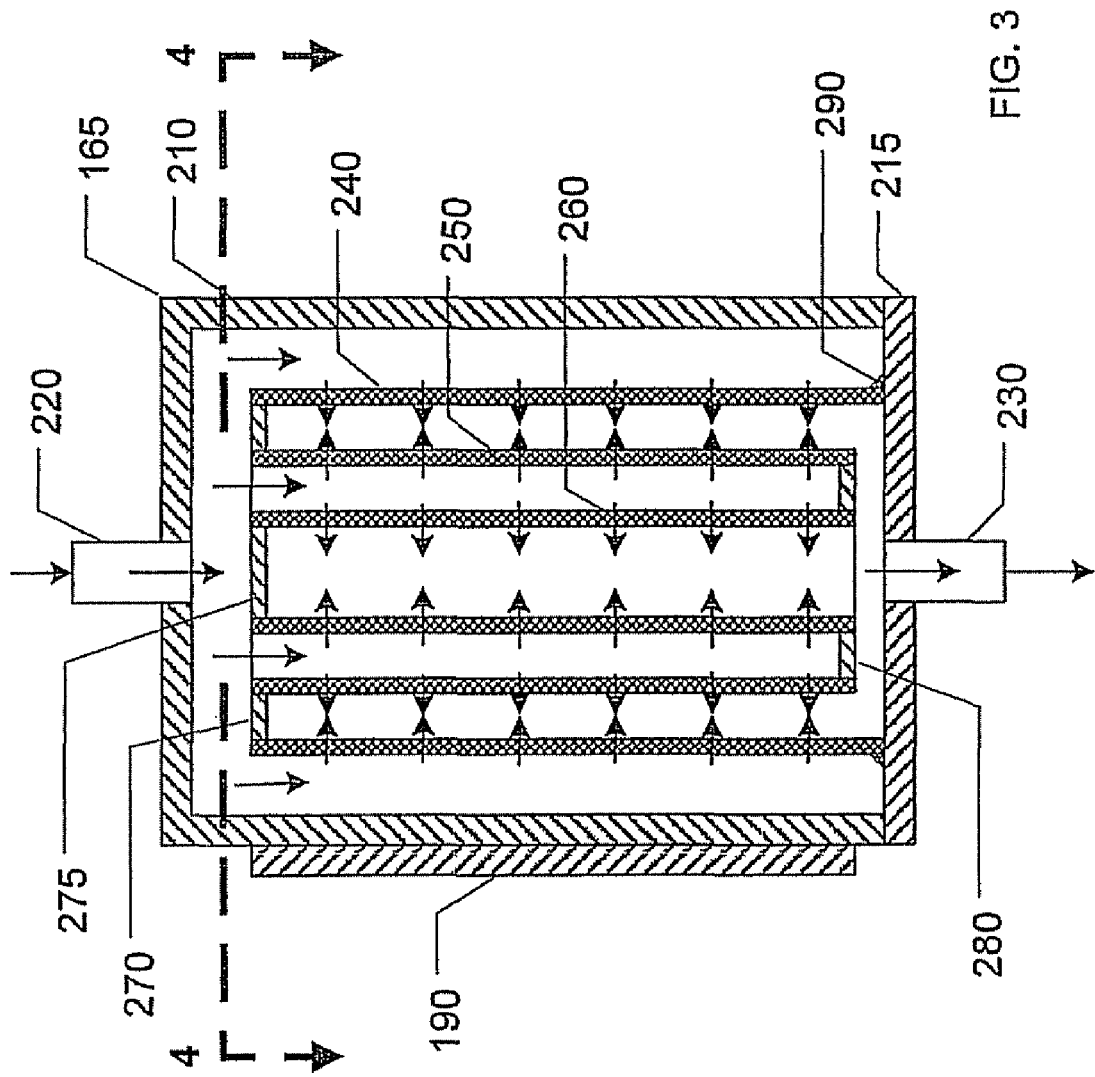
FIG. 3 is a schematic representation of a compact filter with nested tubular filter elements.

In many applications, there is only a limited space for installing the VFA. All components of the VFA must be made to be small, including the filter. FIG. 3 shows a compact filter made of a tubular filter elements. For semiconductor applications, the filter is usually made of metal, such as porous stainless steel and nickel that can be heated to a sufficiently high temperature to meet the process requirements.

In FIG. 3, the filter is shown generally at 165. The filter is comprised of a cylindrical metal housing, 210, welded to a metal base 215. The housing is provided with an inlet 220 to allow the gas to enter and an exit 230 to allow the gas to exit. Within the cylindrical metal housing 210 is a series of tubular porous metal filter elements, 240, 250 and 260 of progressively smaller diameter, one nestled inside the other. These tubular filter elements are welded or otherwise secured on the top to a flat metal piece or wall member 270 between elements 240 and 250, and a metal piece or wall member 275 closing the inlet end of element 260. On the bottom end a flat metal piece or wall member 280 is shown between elements 250 and 260. Metal pieces or wall members 270, 275 and 280 can either be a solid metal, or a porous metal similar to that used for the tubular filter elements, or can be of other suitable materials. The bottom of filter element 240 is welded or otherwise secured to metal base 215, the weld being shown at 290. With these welds, or other securing material, the tubular filter elements 240, 250 and 260, and flat metal pieces 270, 275 and 280 form a continuous surface to direct the flow from the inlet 220 into an upstream space in the interior of the housing through which gas flows prior to filtering, and then the flow goes through the porous filter elements, as shown by the arrows, into a downstream space, through which the gas flows after filtering, and the flow then exits the housing through exit 230. The pieces of material 270, 275, and 280 can be other than flat (wavy or curved) and may be of any selected material, as long as they are secured in place so that they direct the flow to satisfactorily pass through the walls of the tubular filter elements. The filter elements do not have to be made of metal, but can be suitable filter material that can be formed into a tube as shown. The housing also can be of other selected materials that will support the filter tubes.

Heater 190 is provided on the housing 210 and is operated to keep the temperature of the filters at a level sufficient to avoid vapor condensation on the filters, and the rest of the apparatus.

Figure 4:
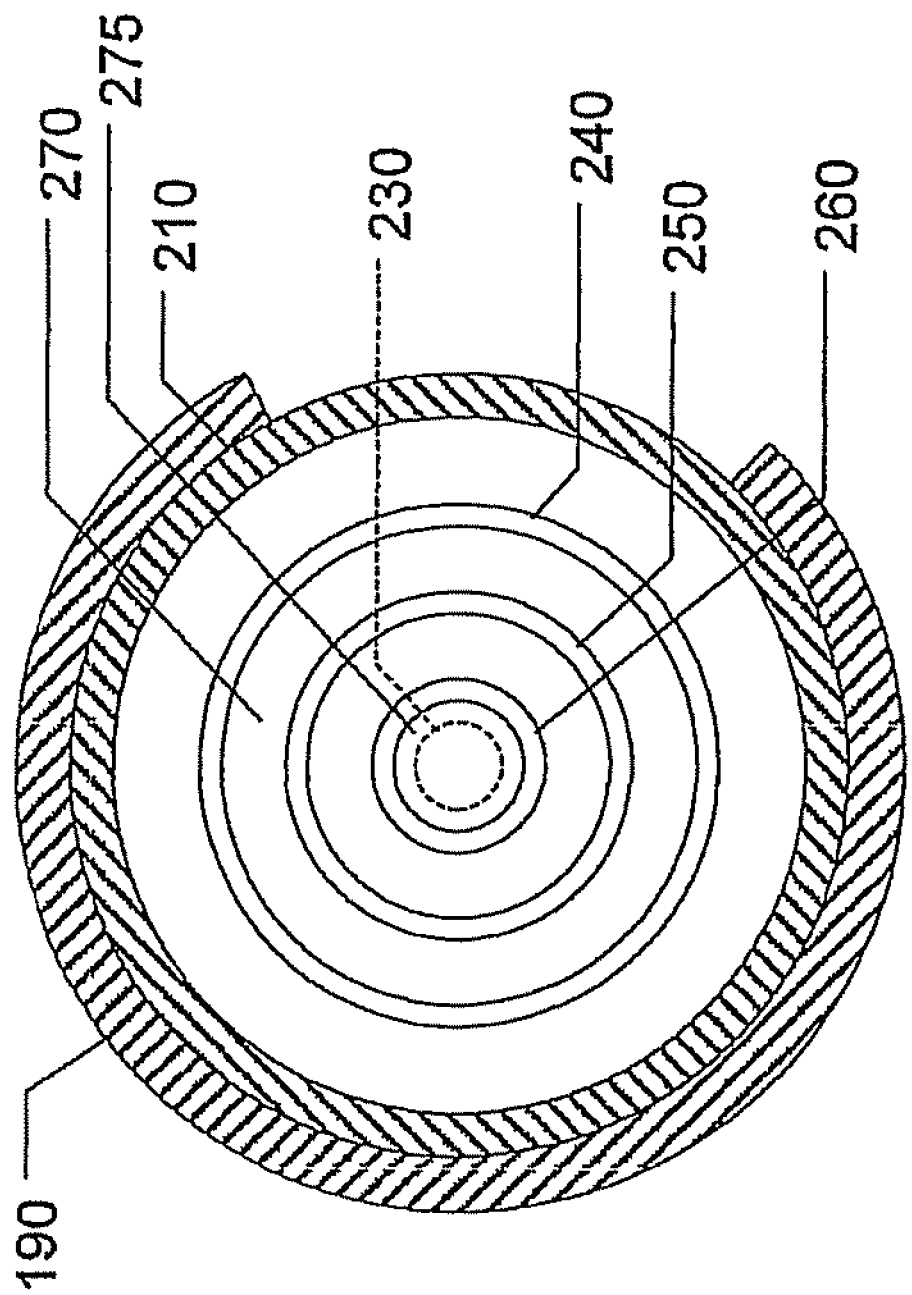
FIG. 4 is a sectional view taken on line 4-4 in FIG. 3.

The nested filter of FIGS. 3 and 4 provides an extremely compact design to allow a large filter area to be placed inside a small, compact cylindrical housing. This compact filter makes it possible to provide a high degree of filtration with a long filter life that is not possible with conventional tubular filter designs.

The method and apparatus described in this disclosure is most useful when the film deposition process takes place in vacuum. However, the same method and apparatus are also useful for deposition processes that take place at atmospheric pressure or at an elevated pressure above atmospheric. Placing a filter between two isolation valves in the manner describe will permit the clogged filter to be removed and replaced without having to open deposition chamber 30 and all components and conduits in fluid communication with chamber 30 to atmospheric air, which would subject these parts to contamination by atmospheric air. A closed filter can be removed and replaced and the new filter can be pumped down and out gassed by itself in isolation to greatly reduce the tool down time due to filter change.

Although the present invention has been described with reference to preferred embodiments, workers skilled in the art will recognize that changes may be made in form and detail without departing from the spirit and scope of the invention.

What is claimed is:

1. An apparatus for thin film deposition and semiconductor device fabrication including:
   a. a vaporizer to generate a gas/vapor mixture;
   b. a vacuum chamber, containing a substrate on which a thin film is to be formed;
   c. a first filter for removing particles connected to carry a gas/vapor mixture flow from the vaporizer to the vacuum chamber, said first filter comprising a plurality of concentric tubular porous metal filter elements of size to nest inside others and having wall members positioned around and between the tubular porous metal filter elements to form a flow path through tubular porous metal filter elements,
   d. a first set of isolation valves, including an isolation valve between the first filter and the vacuum chamber, selectively operable to allow and prevent said gas/vapor mixture flow to flow through said tubular porous metal filter elements of the first filter to the vacuum chamber; and
   e. a temperature controller configured to control said first filter and said first set of isolation valves at a temperature sufficient to prevent vapor condensation on said filter and said first set of isolation valves.

2. the apparatus of claim 1, further comprising a second filter connected to carry flow from the vaporizer to the vacuum chamber in flow parallel with the first filter, and a second set of isolation valves to selectively allow and prevent flow through the second filter independently of the first set of isolation valves.

3. A thin film deposition and semiconductor device fabrication apparatus, said apparatus including a vaporizer to generate a gas/vapor mixture, a chamber for holding a substrate on which a thin film of the gas/vapor mixture is to be deposited, and metal housing defining an interior housing space, and the metal housing being provided with
   a. an inlet coupled to the vaporizer and an outlet coupled to the chamber for permitting a gas/vapor mixture to enter and exit the interior housing space, said gas/vapor mixture containing a vapor for film deposition, and
   b. a plurality of tubular porous metal filter elements of progressively smaller size, placed one inside the other to form a nested porous metal filter structure in the housing, said tubular porous metal filter elements having first and second ends, a first end of an outer tubular porous metal filter element welded to an outlet end base wall of the housing, and inner porous metal filter elements being joined to the outer tubular porous metal filter element and to each other by metal pieces extending between adjacent tubular porous metal filer elements and welded to selected ends of the porous metal filter elements, so form a continuous gas flow structure separating the interior housing space into an upstream space and a downstream space, such that a gas/vapor mixture entering the metal housing through the inlet will flow into the upstream space, then through the tubular porous metal filter elements into the downstream space an through the outlet of said metal housing to the chamber.

4. The filtration apparatus of claim 3, further comprising a heater in thermal contact with said metal housing to heat the metal housing to a temperature sufficient to prevent vapor condensation in said apparatus.

\* \* \* \* \*

UNITED STATES PATENT AND TRADEMARK OFFICE
CERTIFICATE OF CORRECTION

PATENT NO. : 8,297,223 B2
APPLICATION NO. : 12/235114
DATED : October 30, 2012
INVENTOR(S) : Benjamin Liu, Yamin Ma and Thuc Dinh Page 1 of 1

It is certified that error appears in the above-identified patent and that said Letters Patent is hereby corrected as shown below:

In the Claims:

Col 7, lines 28-29: "to nest inside" should be --to nest one inside--

Col 7, line 40: "said filter" should be --said first filter--

Col 8, line 27: "so" should be --to--

Signed and Sealed this
Twelfth Day of August, 2014

Michelle K. Lee
*Deputy Director of the United States Patent and Trademark Office*